(12) United States Patent
Fan et al.

(10) Patent No.: US 8,835,775 B2
(45) Date of Patent: Sep. 16, 2014

(54) LOCALIZED SKEW COMPENSATION TECHNIQUE FOR REDUCING ELECTROMAGNETIC RADIATION

(75) Inventors: Hongmei Fan, Shanghai (CN); Xiaoxia Zhou, Shanghai (CN); Alpesh U. Bhobe, Salinas, CA (US); Jinghan Yu, Shanghai (CN); Hailong Zhang, Shanghai (CN); Phillipe Sochoux, Emerald Hills, CA (US)

(73) Assignee: Cisco Technology, Inc., San Jose, CA (US)

( * ) Notice: Subject to any disclaimer, the term of this patent is extended or adjusted under 35 U.S.C. 154(b) by 393 days.

(21) Appl. No.: 13/296,304

(22) Filed: Nov. 15, 2011

(65) Prior Publication Data

US 2013/0118790 A1    May 16, 2013

(51) Int. Cl.
*H05K 1/16*    (2006.01)
*H05K 1/02*    (2006.01)

(52) U.S. Cl.
CPC .... *H05K 1/0245* (2013.01); *H05K 2201/09272* (2013.01); *H05K 2201/09263* (2013.01); *H05K 1/0248* (2013.01)
USPC ........... 174/260; 174/261; 174/250; 361/760; 361/777

(58) Field of Classification Search
CPC .............. H05K 1/0248; H05K 1/0245; H05K 2201/09263; H05K 2201/09272
USPC .......... 174/250, 260, 261, 267, 268; 361/748, 361/760, 767, 777
See application file for complete search history.

(56) References Cited

U.S. PATENT DOCUMENTS

| | | | |
|---|---|---|---|
| 6,347,041 B1 * | 2/2002 | Hailey et al. | 361/777 |
| 7,830,223 B2 * | 11/2010 | Ahmad | 333/33 |
| 2007/0222533 A1 * | 9/2007 | Lai | 333/4 |
| 2009/0188711 A1 | 7/2009 | Ahmad | |
| 2009/0204934 A1 * | 8/2009 | Lin | 716/14 |
| 2011/0203834 A1 * | 8/2011 | Yoneya et al. | 174/250 |
| 2012/0152607 A1 * | 6/2012 | Chen et al. | 174/266 |

OTHER PUBLICATIONS

Wikipedia, "Differential Signaling", Feb. 15, 2008.*
Sochoux et al., "EMI from SerDes Differential Pairs," DesignCon 2009.
Archambeault et al., "EMI Emissions from Mismatches in High Speed Differential Signal Traces and Cables," DesignCon 2007.
Fan et al., "Impact of Bend Routing on Radiated Emission from Differential Signal Pairs," 2011 Asia Pacific Symp. Electromagn. Compat., Jeju, May 2011.

* cited by examiner

*Primary Examiner* — Hoa C Nguyen
*Assistant Examiner* — Amol Patel
(74) *Attorney, Agent, or Firm* — Edell, Shapiro & Finnan, LLC

(57) ABSTRACT

Techniques are provided for electrically connecting components on a printed circuit board (PCB), semiconductor chip package, or other electronic device. More specifically, a first component, configured to generate a differential signal, is disposed on the PCB, while a second component, configured to receive the differential signal from the first component, is also disposed on the PCB. A differential conductor pair comprising first and second parallel conductors extends along a path between the first and second components. The path of the differential conductor pair comprises at least one turn that causes a change in direction of the first and second conductors. The first conductor comprises at least one localized skew compensation bend disposed at the turn such that, at the end of the turn, the first and second conductors have substantially the same length with respect to the first component.

23 Claims, 14 Drawing Sheets

LOCALIZED SKEW COMPENSATION TECHNIQUE FOR REDUCING ELECTROMAGNETIC RADIATION

TECHNICAL FIELD

The present disclosure relates generally to routing signals on a printed circuit board.

BACKGROUND

Signal lines, conductors, or traces (collectively referred to herein as conductors) are used to relay signals between devices on a printed circuit board (PCB), semiconductor chip package, or other electronic device. In certain circumstances, differential signaling is used to relay such signals. Differential signaling is a signaling method in which two complementary (positive and negative) signal components are simultaneously transmitted along a differential conductor pair, one signal component along each of the conductors. Differential signaling generally enhances noise immunity, reduces transient currents, and enhances effective signal transmission.

If the two conductors in the differential conductor pair have a length difference, the simultaneously transmitted signals will arrive at a destination at different times. This difference in arrival time (propagation delay) is referred to as "skew" and may cause, for example, a phase difference between the signals at the destination, referred to as phase skew. If the phase skew is sufficiently severe, reception of the differential signals at the destination becomes difficult.

DESCRIPTION OF EXAMPLE EMBODIMENTS

Overview

Figure 1:
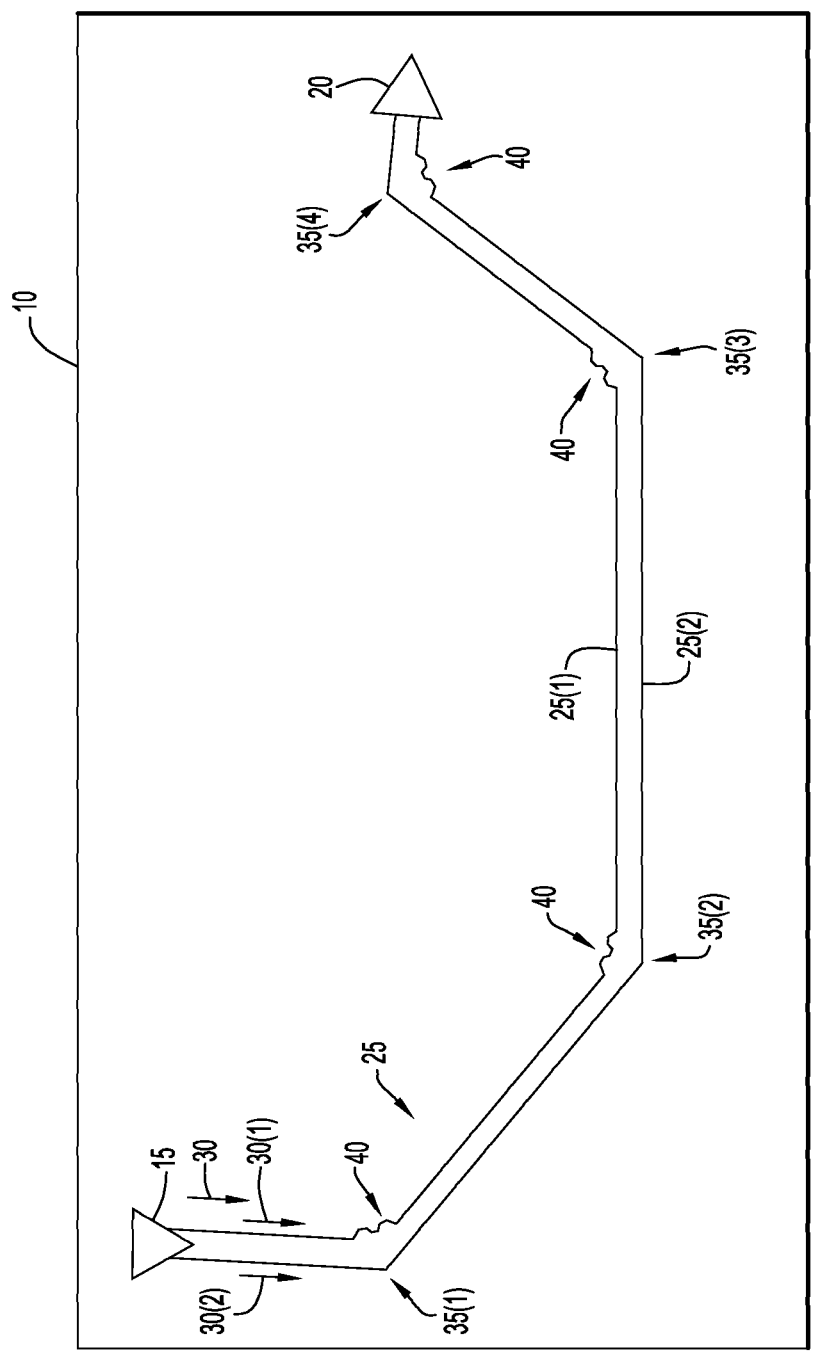
FIG. 1 is schematic view of a printed circuit board (PCB) in which electrical components are connected by a differential conductor pair having a plurality of localized skew compensation bends implemented where there is a localized skew created by a routing bend, referred to herein as the "Where bend where compensate" (WBWC) technique.

Techniques described herein generally relate to electrically connecting components on a printed circuit board (PCB), semiconductor chip package, or other electronic device (collectively referred to as PCBs herein). More specifically, a first component, configured to generate a differential signal, is disposed on the PCB, while a second component, configured to receive the differential signal from the first component, is also disposed on the PCB. A differential conductor pair comprising first and second parallel conductors extends along a path between the first and second components. The path of the differential conductor pair comprises at least one turn that causes a change in direction of the first and second conductors. The first conductor comprises at least one localized skew compensation bend disposed at the turn such that, at the end of the turn, the first and second conductors have substantially the same length with respect to the first component.

Example Embodiments

Differential signaling is a signaling method in which two complementary (signal components are simultaneously transmitted along a differential conductor pair. Generally, each line of a differential pair should have an equal length to avoid skew causing signal integrity concerns. However, in differential pairs in which the two lines have the same length, there may still be two main conditions that generate skews. One condition that generates skews is a result of the pin escape offset for differential pair around the pin-field area. The other condition that causes skew is the routing of bends in the differential pair.

In certain conventional systems, to compensate for skews in a differential pair, an extra length is added on the shorter trace. In practical PCB routing, usually engineers (e.g., computer aided drafting (CAD) engineers) only consider the overall length of trace pairs at the final stage, and then, if necessary, put a few bends at random location in the pair in order to de-skew the overall pair length. This satisfies signal integrity concerns resulting from an overall length mismatch. However, such random positioning of the de-skewing bends can result in an increase in the electromagnetic radiation (EMI) that is generated by the differential pair.

Described herein is a first technique, referred to as a "Where bend where compensate" (WBWC) technique, that may be implemented to compensate for skew in a manner that does not result in an increased EMI. More specifically, the WBWC technique locally compensates for localized skew created by a routing bend (i.e., localized skew compensation). As noted above, conventional techniques ensure the same overall pair length, without performing any localized skew compensation.

Also described herein is a second technique, referred to as a Serial bends single compensation (SBSC) technique that may also be implemented to compensate for skew. More specifically, the SBSC technique compensates for localized skew created by the pin escape offset for a differential pair around the pin-field area. As noted above, conventional techniques often place a few bends to compensate the overall skew in a random position, and do not, as described below in accordance with the SBSC techniques, immediately compensate for the skew close to the pin-field area.

Illustrated below are several example arrangements for structures used in accordance with the WBWC and SBSC techniques. It is to be appreciated that the actual structures used in the WBWC and SBSC techniques can be varied and are not limited to the example shapes listed below.

FIG. 1 is schematic view of a printed circuit board (PCB) 10. As shown, disposed on PCB 10 is a first electrical component 15 that is connected to a second electrical component 20 by a differential conductor pair 25 implemented in accordance with an example WBWC technique. The differential conductor pair 25 comprises first and second parallel conductors 25(1) and 25(2), respectively.

The first component 15 is configured to generate a differential signal (represented by arrow 30 in FIG. 1) for transmission to the second component 20. Differential signal 30 is a signal having first and second complementary signal components (represented by arrows 30(1) and 30(2), respectively) that are simultaneously sent on the two separate conductors 25(1), 25(2), respectively, of differential conductor pair 25. That is, in the example of FIG. 1, the first component 30(1) of differential signal 30 is transmitted along the first conductor 25(1) while, simultaneously, the second component 30(2) of differential signal 30 is transmitted along the second conductor 25(2). In one example, the complementary components of the differential signal 30 comprise positive and negative components that are simultaneously transmitted along the differential conductor pair 25.

First component 15 may be any electrical component or element configured to generate differential signal 30, while second component 20 may be any electrical component or element configured to receive differential signal 30. In the example of FIG. 1, components 15 and 20 each comprise amplifiers.

As shown in FIG. 1, the path followed by differential pair 25 between first component 15 and second component 20 includes one or more turns (i.e., locations in the path of differential pair 25 in which first and second conductors 25(1) and 25(2) change direction). In other words, after a turn, the longitudinal axis of each of conductors 25(1) and 25(2) extends in a direction that is different from the direction before the turn. In the example of FIG. 1, the path of differential pair 25 includes four turns 35(1), 35(2), 35(3), and 35(4). The turns or bends in the differential pair 25 are often necessary to accommodate other components on the PCB 10.

In a conventional arrangement, turns in the differential pair path cause one conductor in the pair to have a length that is longer than the length of the other conductor in the pair. For example, as a pair of parallel conductors turn, one conductor will be on the inside of the turn (inside conductor), while the other conductor will be on the outside of the turn (outside conductor). At the end of the turn, the outside conductor will have a length, with respect to the starting point (i.e., the transmitting first component), that is longer than the inside conductor. This longer length results in a longer travel path for the signal component on the outside conductor, relative to the signal component on the inside conductor, and, as such, at the end of the turn the signals will no longer be in-phase. Rather, the phase of the signal component on the outside conductor will be delayed, relative to the signal component to on the inside conductor, by a certain amount. This phase difference between the signal components is referred to as phase skew.

When differential signal components 30(1) and 30(2) are transmitted from first component 15, the components are in-phase and operate substantially in the differential mode. While substantially in the differential mode, the electromagnetic interference (EMI) resulting from the signal transmission is suppressed. However, if phase skew occurs, the signal components 30(1) and 30(2) operate substantially in the common mode and the signals will emit significant EMI (relative to the differential mode transmission) and the signal quality may degrade. Additionally, as noted above, in order for second component 20 to properly reconstruct differential signal 30, the differential signal components 30(1) and 30(2) should be in-phase when they are received at second component 20. As such, phase skew may prevent proper reception of the signals by second component 20.

Described herein are skew compensation techniques that ensure proper signal reception at second component 20, as well as reduce EMI resulting from significant common mode propagation. As detailed below, example techniques analyze several criteria to optimize the skew compensation, including: (1) when to perform the skew compensation, (2) where to perform the skew compensation, and (3) how to perform the skew compensation.

Figure 2:
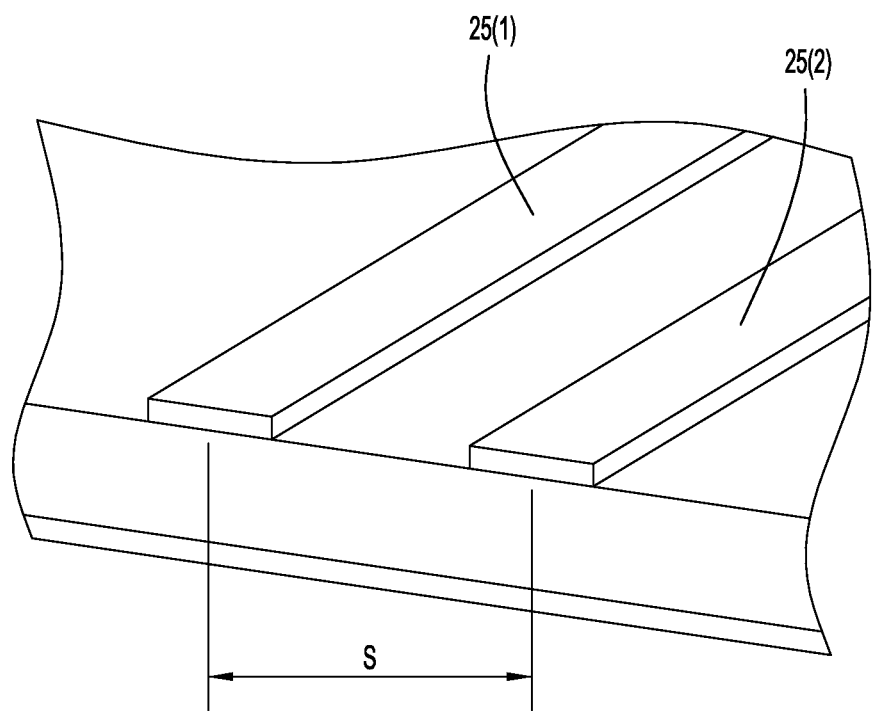
FIG. 2 is a schematic view of a pitch to pitch spacing of a differential conductor pair implemented in accordance with techniques described herein.
Figure 3A:
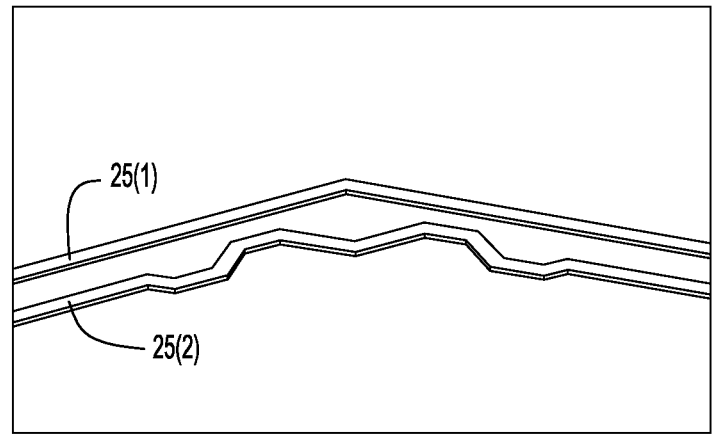
FIGS. 3A-3D are schematic views of a plurality of localized skew compensation bends formed in a differential conductor pair in accordance with example WBWC techniques.
Figure 3B:
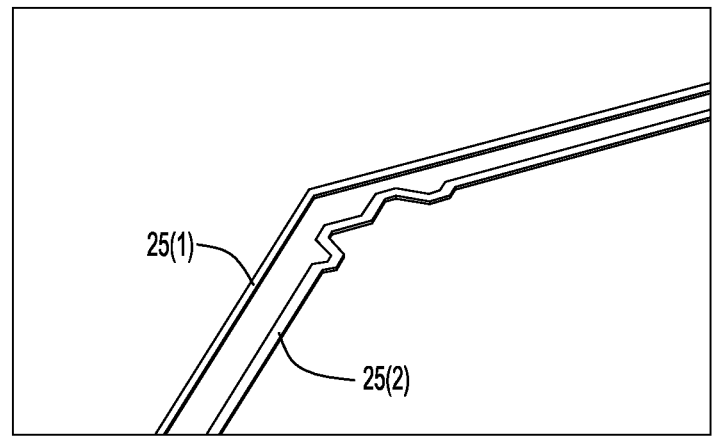
Figure 3C:
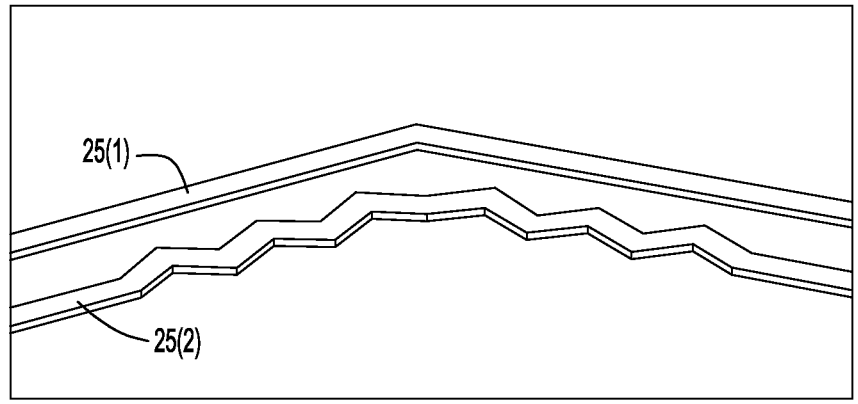
Figure 3D:
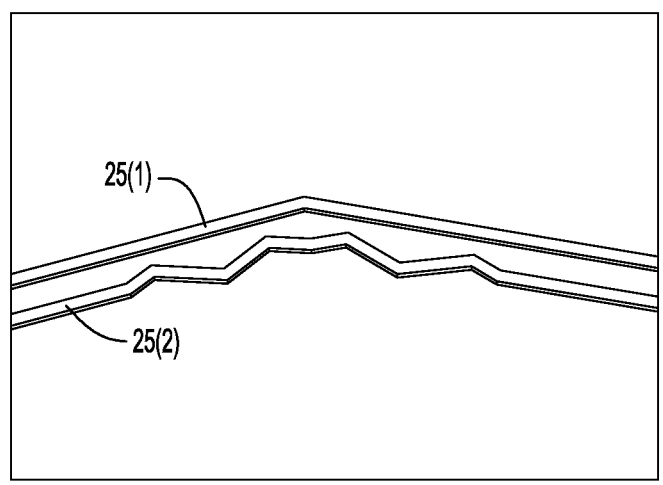

With respect to the first determination of when to perform the skew compensation, it has been discovered that skew lengths (i.e., length differences) over a certain amount cause significant signal degradation and/or significant EMI. It has been discovered that a total radiated power (TRP) (including the emissions from the signals on the differential pair, epoxy medium, and ground plane) increase of greater than 3 decibels (dB) occurs when a skew has a length (Skew$_l$) greater than 1.5 s, where s is the pitch to pitch spacing of the conductor pair (i.e. 1.5 times the pitch to pitch spacing) (see FIG. 2). As such, in specific examples, it is desired to perform compensation when a local Skew$_l$ is greater than 1.5 s.

Next, with respect to the second determination of where to perform the skew compensation, in the example of FIG. 1, phase skew is immediately corrected at each of the turns 35(1), 35(2), 35(3), and 35(4) through the use of localized skew compensation bends. As shown, the skew compensation bends are localized (i.e., positioned at or proximate) to each of turns 35(1), 35(2), 35(3), and 35(4). As such, at or proximate the end of each of the turns, the length of conductors 25(1) and 25(2), with respect to first component 15, are substantially the same. The use of skew compensation bends ensures that at the end of each of the turns the signal components 30(1) and 30(2) remain substantially in-phase and continue to operate substantially in the differential mode, even between subsequent turns. If localized skew compensation was not used (i.e., skew compensation occurred only at the end of the differential path), signal components 30(1) and 30(2) would operate in the common mode for substantial lengths of the differential path, resulting in the generation of significant EMI. As detailed below, skew compensation bends may have any number of different configurations (sizes, shapes, etc.)

Furthermore, for a skew on the signal source side (i.e., close to the first component 15), such as the pin-field area, the compensation substantially should be close to the source. In one particular example, the compensation should be performed within a predetermined distance, referred to as bend offset (δ), of less than 120 mil. That is, in this example, skew on the signal source side should be compensated for within 120 mil of the source.

With respect to the third determination of how to compensate for the skew, this may depend on the PCB routing situation. FIGS. 3A-3D illustrate example configuration for use in compensating for the skew shown in detail in FIG. 3. As such, the WBWC techniques described herein are configured to locally compensate for skew by providing, for example, the one of the structures of FIGS. 3A-3D at the bend location to make trace pairs to have the same length locally. That is, the compensation structures are implemented where there is a localized skew created by a routing bend.

Figure 4:
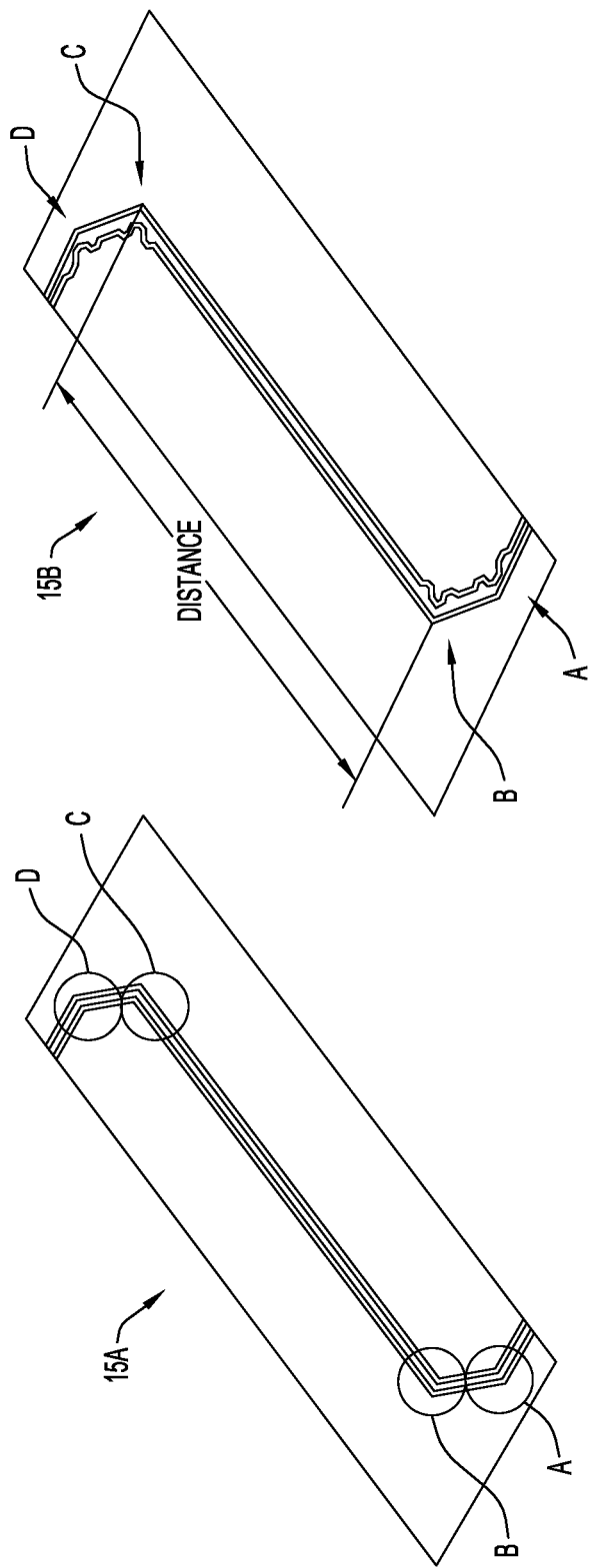
FIG. 4 illustrates two schematic views of a differential pair which may be implemented in accordance with an example WBWC technique.

FIG. 4 illustrates a differential pair in two different configurations, configuration 15A and configuration 15B. As shown, there are four (4) localized skew areas identified in FIG. 4 as A, B, C and D. In the arrangement of 15A, despite the existence of four skew areas, the overall skew is zero (0), and hence the signal integrity is not affected. However, at each localized skew point, there is common-mode current generated which increases EMI. By using the WBWC structures at each localized skew area in the configuration of 15B, EMI will be reduced by approximately 3-7 dB for 5-20 GHz. However, this EMI suppression depends on the distance between the areas B and C. If the distance is reasonably short (<300 mil), the common-mode current does not exist for long time and then the EMI impact is small.

Figure 5:
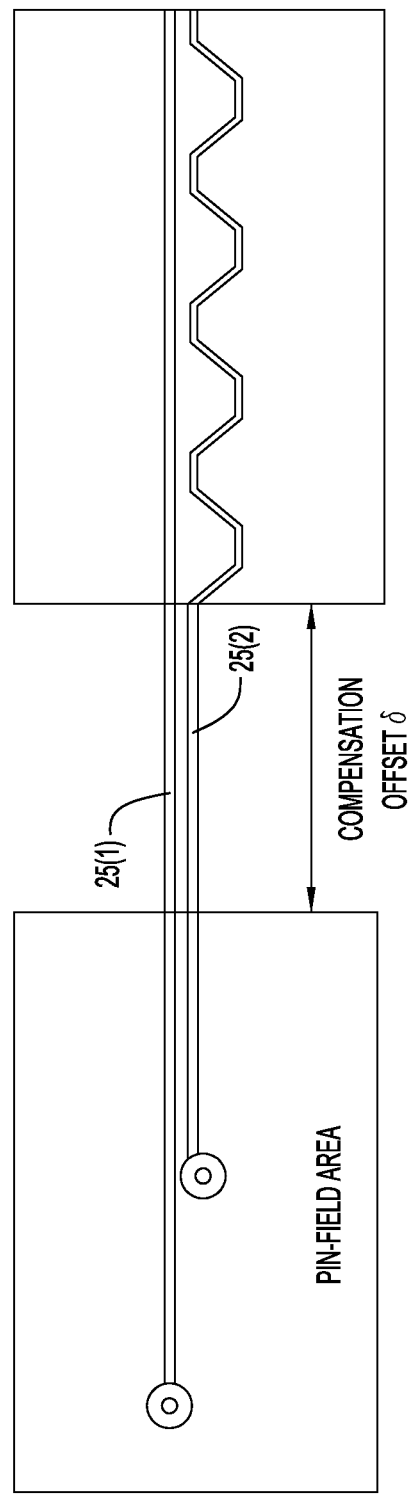
FIG. 5 is a schematic view of a plurality of localized skew compensation bends implemented in accordance with a serial bends single compensation (SBSC) technique in order to compensate for a localized skew created by the pin escape offset for differential pair around the pin-field area.

Another example configuration for use in compensating for the skew is shown in detail in FIG. 5. This SBSC structure is implemented by the pin escape offset for differential pair around the pin-field area. This SBSC technique involves implementing the SBSC structure using serial bends to compensate for the accumulated skew in a single time, not only to make trace pairs to have the same length locally, but also as close to where the skew happens as possible.

Figure 6:
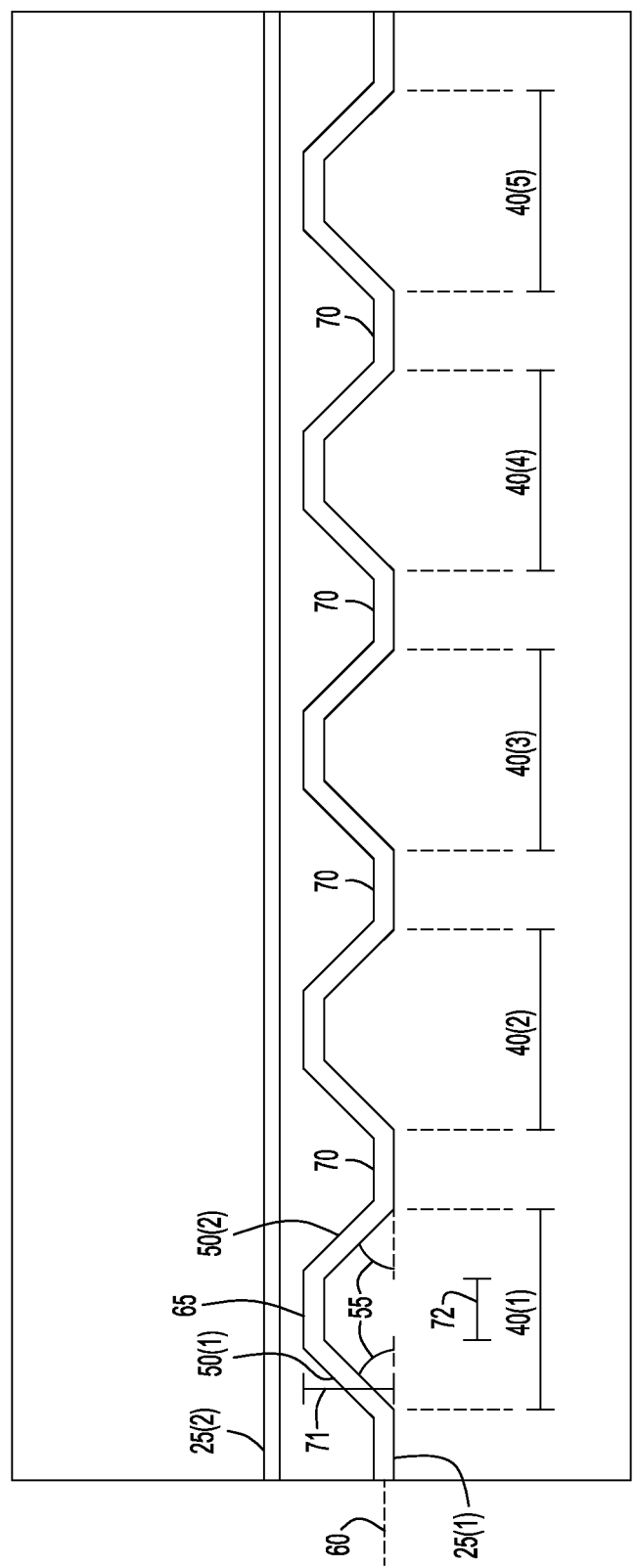
FIG. 6 is a schematic view of a plurality of localized skew compensation bends in a differential conductor pair using an example WBWC or SBSC technique.

FIG. 6 is an expanded schematic view of a plurality of skew compensation bends using an example SBSC or WBWC technique. In this example arrangement, five skew compensation bends 40(1), 40(2), 40(3), 40(4), and 40(5) are shown, and each of the bends have substantially the same configuration. As such, only details of skew compensation bend 40(1) are shown in detail in FIG. 6. It is to be appreciated that the use of five skew compensation bends is merely illustrative and, as detailed below, different numbers of skew compensation bends may be used in other examples.

Skew compensation bend 40(1) comprises first and second segments 50(1) and 50(2), respectively, of conductor 25(1), that are angled with respect to a longitudinal axis 60 of the first conductor prior to the first turn 35(1). That is, in this example, the first and second segments 50(1) and 50(2) extend at an angle 55 from the direction of travel of conductor 25(1) prior to the turn. It is to be appreciated that the first and second segments 50(1) and 50(2) may alternatively be angled with respect to the longitudinal axis of conductor 25(1) after the turn (i.e., angled with respect to the direction of travel of conductor 25(1) after the turn). It is to be appreciated that angle 55 may vary depending on, for example, the characteristics of the differential pair, shape of the turn, differential signal characteristics, etc. However, in one specific example, angle 55 is approximately 45 degrees.

As shown, a third segment 65 is disposed between and connects the first segment 50(1) to the second segment 50(2). The third segment 65 is substantially parallel to a longitudinal axis of the first conductor prior to or after the turn 35(1) (e.g., parallel to axis 60). As such, each skew compensation bend 40(1)-40(5) comprises three segments (segments 50(1), 50(2), and 65) that define a frusto-conical shape. Furthermore, each of the skew compensation bends 40(1)-40(5) are separated by a substantially straight segment 70 of the first conductor 25(1).

As shown, the angled segments 50(1) and 50(2) have a vertical length ($Bend_V$) 71, and parallel segment 65 has a straight length ($Bend_S$) 72. It is to be appreciated that different lengths may be used for these values. However, in one specific example, the bends have a $Bend_V$ 71 that is less than 1/16 of the wavelength of the signal components. Additionally, in this specific example, the bends have a $Bend_S$ 72 in the range of approximately 0.5 to 1 times $Bend_V$ 71. That is, the ratio (k) of the straight length of a bend to the vertical length of the bend should be in the range of approximately 0.5 to 1.

In certain circumstances, the suitable dimensions for a bend (i.e., values for $Bend_S$ and $Bend_V$) can be calculated using Equations (1) and (2), below.

$$Bend_V = \frac{Skew_l}{Bend_n \times (2\sqrt{2} - 2)} \quad \text{Equation (1)}$$

where $Skew_l$ is the length of the skew to be compensated and $Bend_n$ is the number of bends to be used for the compensation.

$$Bend_S = k \times Bend_V \quad \text{Equation (2)}$$

For a local skew caused by two or more turns (referred to as an accumulated skew), outside of the source area, if the $Skew_l$ is less than 1.5 s, no skew compensation may be utilized. However, if the accumulated skew is greater than 1.5 s, and the next turn increases the skew, then skew compensation is used at each turn. If an accumulated skew is greater than 1.5 s and the next turn decreases the skew, then the distance between the accumulated skew and the next turn is calculated. If this distance is longer than 300 mil, then skew compensation is used for the accumulated skew, and at the next turn as well, because significant EMI will be generated as the signal components propagate in the common mode for this long distance (i.e., the distance greater than 300 mil). If the distance is less than 300 mil, no skew compensation is used at the accumulated skew, but the accumulated skew is recalculated at the end of the next turn to determine where compensation should be performed.

Figure 7A:
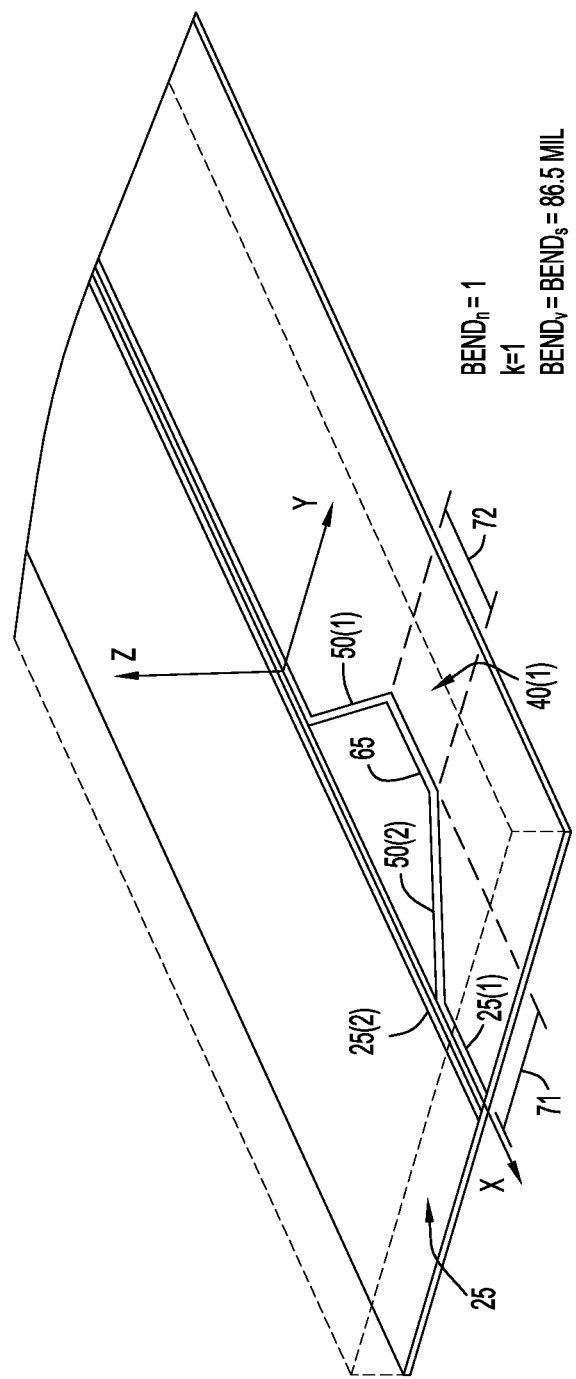
FIGS. 7A-7C are schematic views of different combinations of one or more localized skew compensation bends that may be used in accordance with an example WBWC or SBSC technique.
Figure 7B:
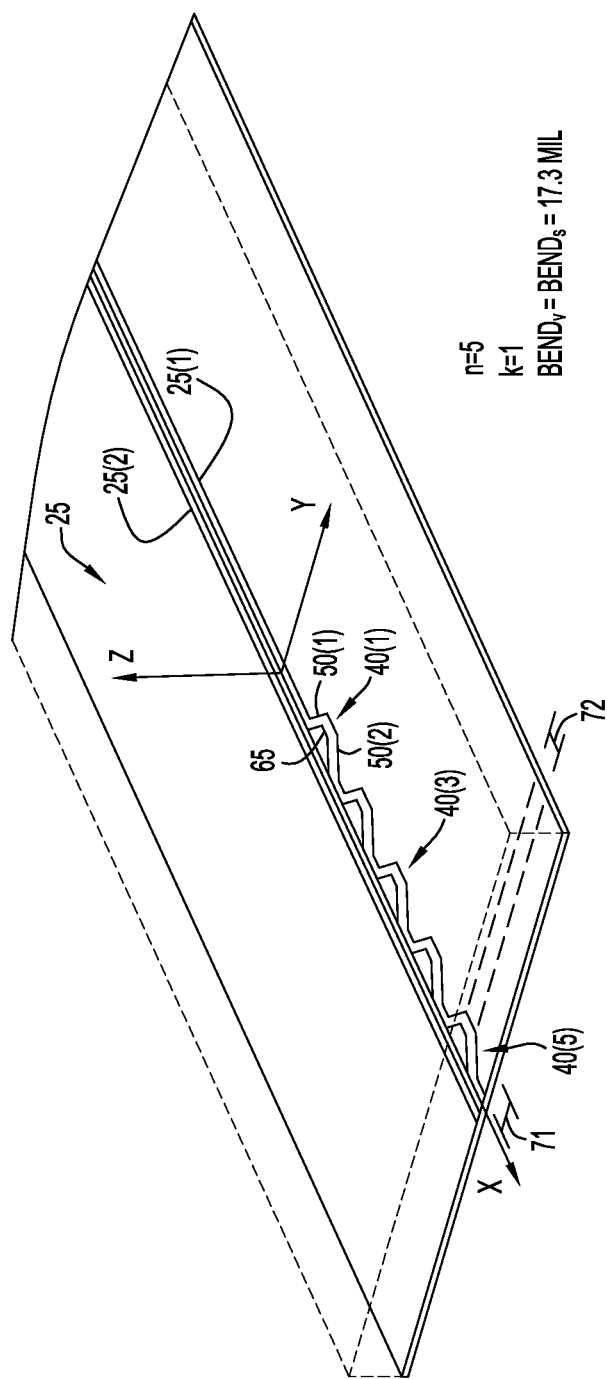
Figure 7C:
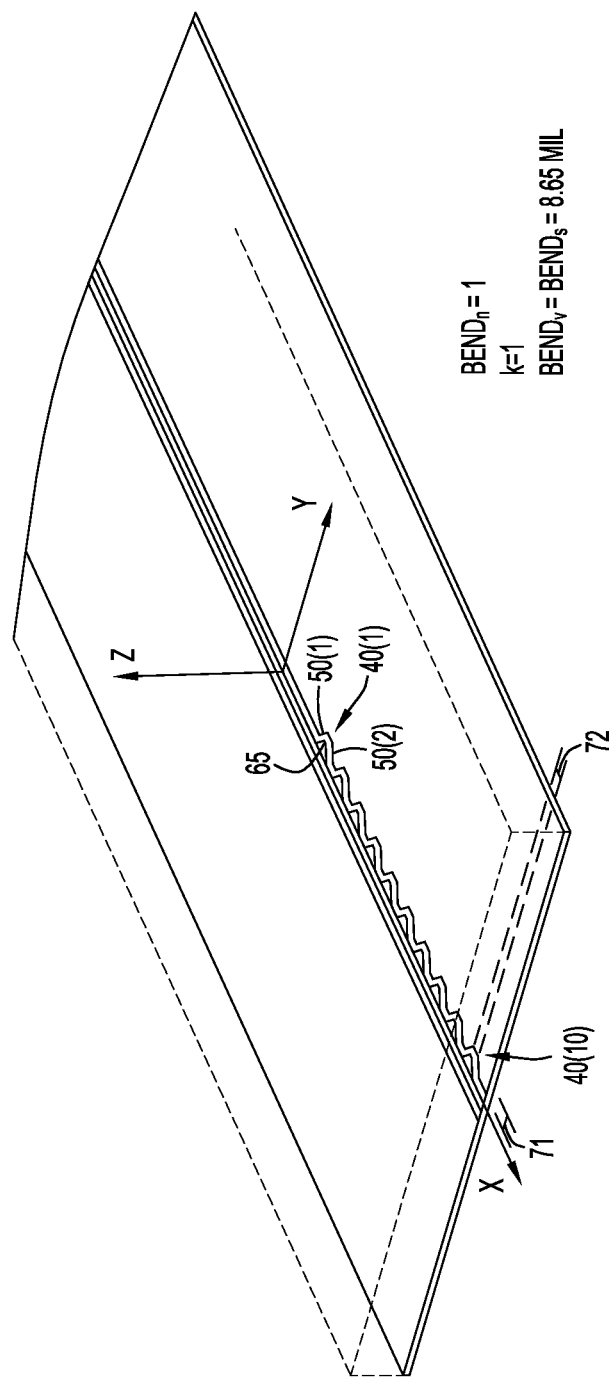

As noted above, in accordance with techniques described herein, the skew compensation bends may have different configurations and may be used in different combinations. FIGS. 7A-7C are schematic views of different example combinations of one or more skew compensation bends 40 that may be used in accordance with techniques described herein. In the examples of FIGS. 7A-7C, it is assumed that the $Skew_l$ (i.e., path difference) introduced by a pin escape offset, is approximately 71.7 mil. That is, in the examples of FIGS. 7A-7C, as a result of the turn, the second conductor would be 71.7 mil longer than the first conductor.

In the example of FIG. 7A, the number (n) of skew compensation bends is one (i.e., n=1), and the selected ratio (k) is also one (i.e., k=1). Because a single skew compensation bend is used to compensate for the approximately 71.7 mil skew, skew compensation bend has a length of approximately 71.7 mil. As such, using Equation (1), a value of approximately 86.5 mil for $Bend_V$ is calculated and, using Equation (2) with a k of 1, a value of approximately 86.5 mil for $Bend_S$ is calculated. As such, in this example, $Bend_V = Bend_S = 86.5$ mil.

In the example of FIG. 7B, the number (n) of skew compensation bends is five (i.e., n=5), and the selected ratio (k) is one (i.e., k=1). Using Equation (1), a value of approximately 17.3 mil for $Bend_V$ is calculated and, using Equation (2) with a k of 1, a value of approximately 17.3 mil for $Bend_S$ is calculated. As such, $Bend_V = Bend_S = 17.3$ mil.

In the example of FIG. 7C, the number (n) of skew compensation bends is ten (i.e., n=10), and the selected ratio (k) is one (i.e., k=1). Using Equation (1), a value of approximately 8.7 mil for $Bend_V$ is calculated and, using Equation (2) with a k of 1, a value of approximately 8.7 mil for $Bend_S$ is calculated. As such, $Bend_V = Bend_S = 8.7$ mil.

In the examples of FIGS. 7A-7C, a ratio of k=1 is used. However, it is to be appreciated that different ratios may be used in alternative arrangements. For example, k may be 1/4 (meaning that $Bend_S$ is one-fourth the length of $Bend_V$), 1/2, (meaning that Bend$_S$ is one-half the length of Bend$_V$), 2, (meaning that Bend$_S$ is two times the length of Bend$_V$), 4, (meaning that Bend$_S$ is four times the length of Bend$_V$), etc.

Furthermore, in the examples of FIGS. 7B and 7C where multiple skew compensation bends are used, each of the elements have substantially the same length (i.e., the elements are each the same size) and have the same shape. However, it is to be appreciated the different shaped and different sized skew compensation bends may be used in combination at a turn of a differential pair, or different shapes/sizes may be used at different turns of a differential pair.

It has been investigated that for a fixed skew length, more small bends produce a higher Sdd21 than fewer big bends when Skew$_i$=71.7 mil, f=5-21 GHz, and Bend$_n$ increases from 1 to 5 to 10. Among the three cases (i.e., n=1, n=5, n=10), 5 bends produces the lowest TRP, where Bend$_V$ is around 17 mil or λ/16 at the highest frequency of 21 GHz. For the ratio k, it is shown that k=0.5-1 gives the optimum combination of Sdd21 and TRP. As such, for some cases, it is suggested to have bends whose Bend$_V$ is less than λ/16, and whose Bend$_S$ is about 0.5-1 times of its Bend$_V$.

As noted above, localized skew compensation bends are used to immediately (locally) compensate for phase skew resulting from a pin escape offset in a differential pair. As used herein, localized means that the compensation occurs at, or proximate to, the pin-field area. In certain circumstances, as shown in FIG. 6, a group of a plurality of skew compensation bends 120 are offset from the location of a turn 125 by a bend offset (δ) of a certain distance. The bend offset may be, for example, 0 (i.e., directly at the turn), 80 mil, 400 mil, or 1600 mil.

In one specific example, for a total differential pair length of 3000 mil and a Skew$_I$ of 71.7 mil, the bend offset δ (varied from 0 to 1600 mil) does not influence Sdd21, but does influence TRP. More specifically, it was discovered that as the bend offset (δ) increased, the TRP also increased. The reason is that with the compensation bends near the skew, the differential pair works in differential mode once the signal passes by the bends, while with bends on the far-end, there are common mode components in the differential pair for a longer period of time.

Figure 8:
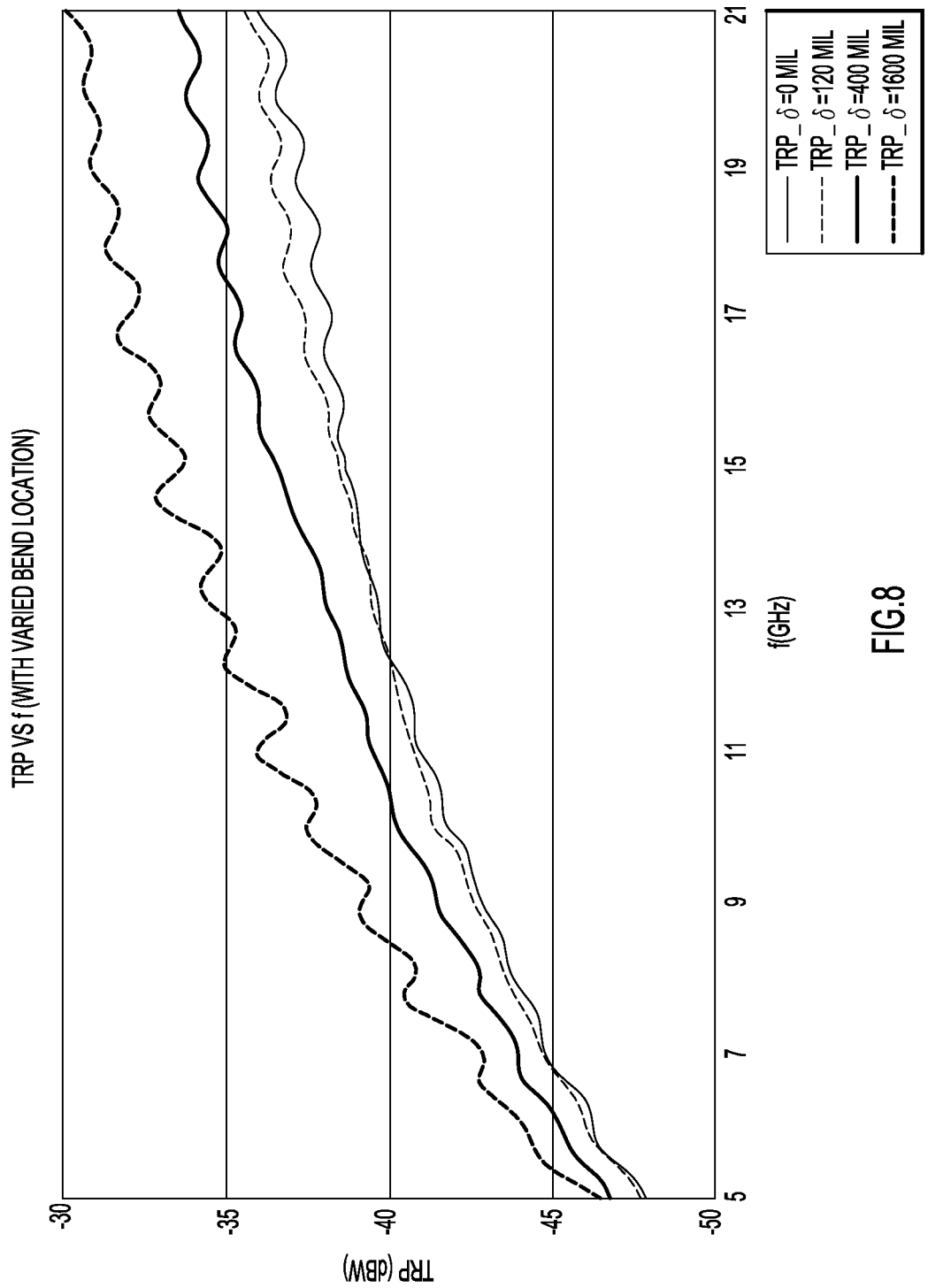
FIG. 8 is a plot illustrating the effects of different positions of localized compensation elements proximate to a turn in a differential pair.

FIG. 8 illustrates the TRP versus frequency of signals propagating along differential conductor pair having the same number of skew compensation bends, but using different bend offsets. More specifically, line 130(1) represents the TRP of signal components 30(1) and 30(2) using five skew compensation bends and a bend offset of 0 mil. Lines 130(2), 130(3), 130(4), 130(5), 130(6), 130(7) and 130(8) illustrate the TRP of signal components 30(1) and 30(2) after skew compensation using five skew compensation bends and offsets of 80 mil, 400 mil, and 1600 mil, respectively, to compensate for the skew occurred by a pin escape offset.

Figure 9:
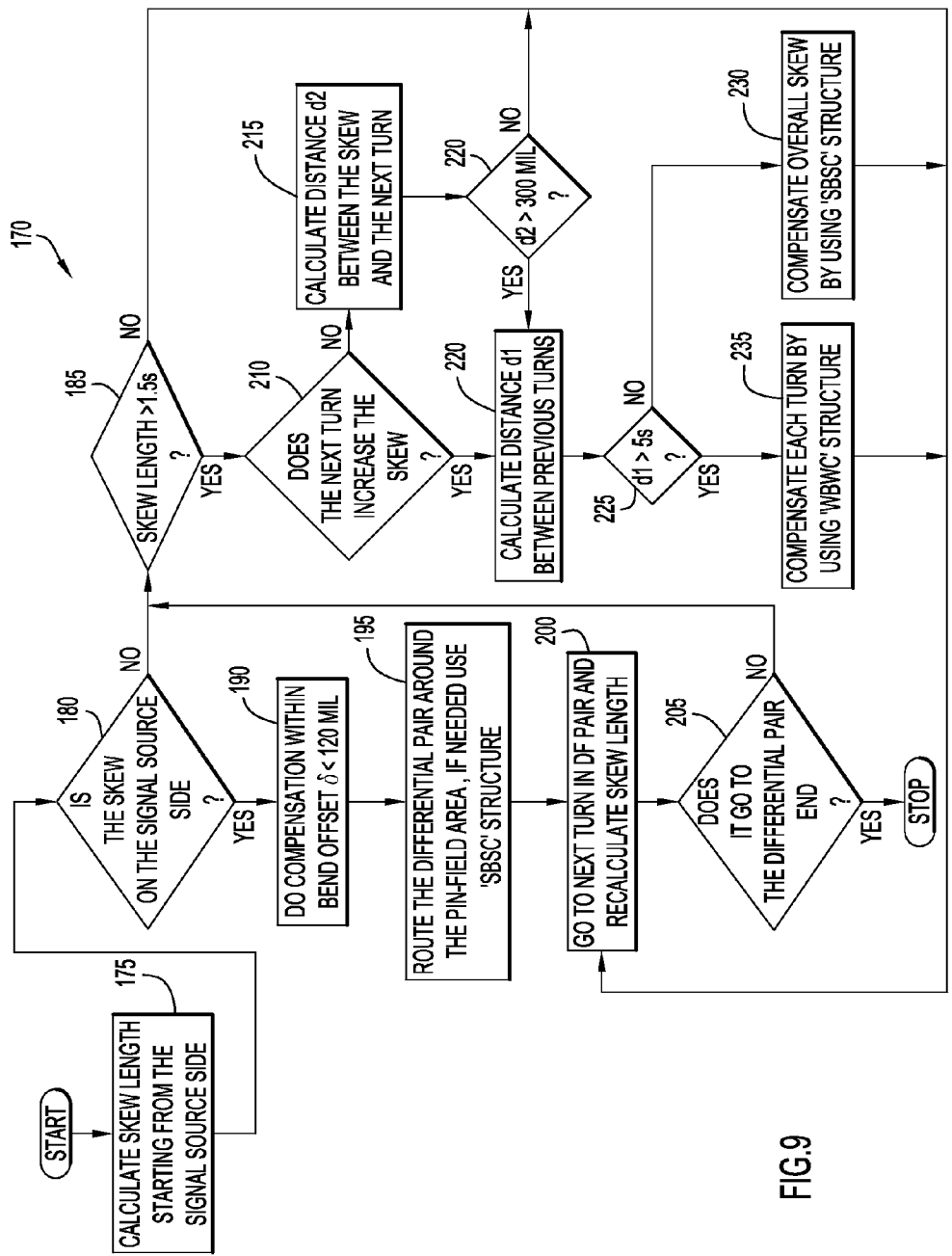
FIG. 9 is a flowchart illustrating a detailed method for compensating for skew in a differential pair.

FIG. 9 is flowchart of a method 170 for analyzing a differential pair to determine if localized skew compensation should be used and, if so, to form the localized skew compensation bends in the differential pair. First, at 175, the skew length is calculated starting from the signal source side. That is, the difference in length between the two conductors in the differential pair is calculated starting from the component that transmits the differential signal on the differential pair.

At 180, a determination is made as to whether the first detected skew is on the signal source side (i.e., close to the signal transmitting component such as pin-field area). If the skew is not on the signal source side, the method proceeds to step 185. Further details of step 185, and subsequent steps, are provided below. If the skew is on the signal source side, a determination is made at 190 to perform the compensation with a pin escape offset of less than approximately 120 mil. At 195, the differential pair is routed around the pin field of the PCB area using 'SBSC' technique.

At 200, the next turn in the differential pair is analyzed, and the skew length at this point is recalculated. At 205, a determination is made as to whether this second analysis is at the end of the differential pair. If so, method 170 ends. However, if the end of the differential pair has not yet been reached, method 170 proceeds to 185. As noted above, if the results of the determination of 180 indicate that the skew is not on the signal source side, method 170 also proceeds to 185. In both cases, at 185, a determination is made as to whether the most recently calculated skew length is greater than 1.5 s (i.e. 1.5 times of pitch to pitch spacing). If not, method 170 returns to 200 where the skew length is recalculated at the next turn.

However, if the skew length is greater than 1.5 s, method 170 proceeds to 210 where a determination is made as to whether the next turn increases the skew length. If not, method 170 proceeds to 215 were the distance (d2) between the present turn and the next turn is calculated. At 220, a determination is made as to whether d2 is greater than 300 mil. If d2 is not greater than 300 mil, method 170 returns to 200 where the skew length is recalculated at the next turn. However, returning to 210, if the next turn increases the skew length, method 170 proceeds to 220 where the distance (d1) between the previous turns is calculated. At 225, a determination is made as to whether d1 is greater than 5 s (i.e., five times the pitch to pitch spacing (s) of the conductors). If d1 is not greater than 5 s, method 170 proceeds to 230 where the overall skew is compensated using SBSC techniques. If d1 is greater than 5 s, method 170 proceeds to 235 where the skew at each of the previous turns is compensated using WBWC techniques.

After 230 or 235, method 170 returns to 200 where the skew length at the next turn is recalculated. The method continues until a determination is made at 205 that the end of the differential pair has been reached.

Figure 10A:
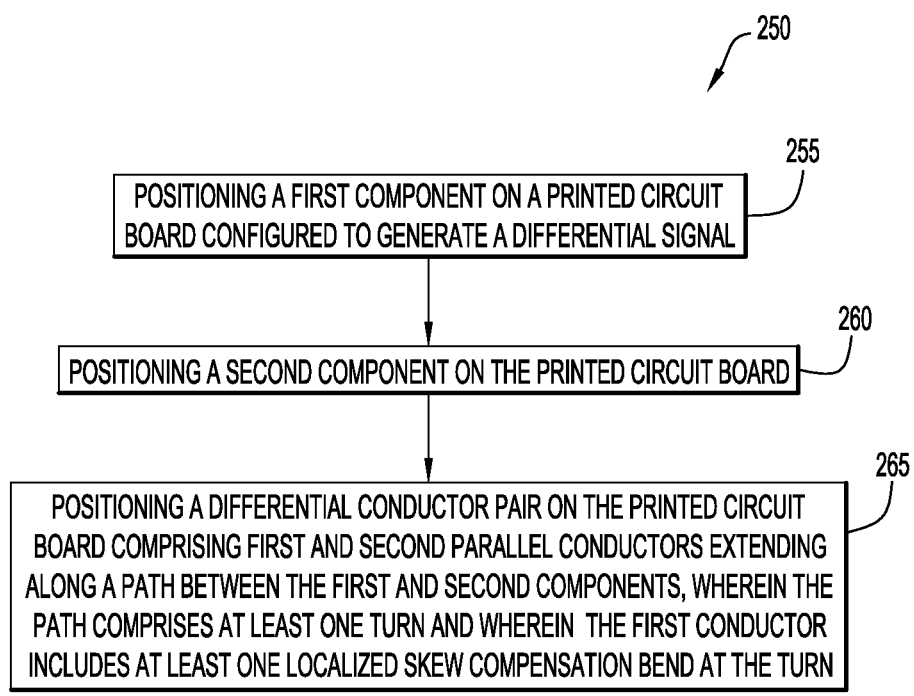
FIGS. 10A and 10B are flowcharts illustrating an example WBWC technique that may be implemented in accordance with techniques described herein.

FIG. 10A is a flowchart of a method 250 implemented in accordance with techniques described herein. Method 250 begins at 255 where a first component is positioned on a printed circuit board (PCB). The first component is configured to generate a differential signal. At 260, a second component configured to receive the differential signal from the first component is positioned on the PCB. At 265, a differential conductor pair is positioned on the PCB. The differential conductor pair comprises first and second parallel conductors extending along a path between the first and second components. The path comprises at least one turn and, at the turn, the first conductor includes at least one localized skew compensation bend.

Figure 10B:
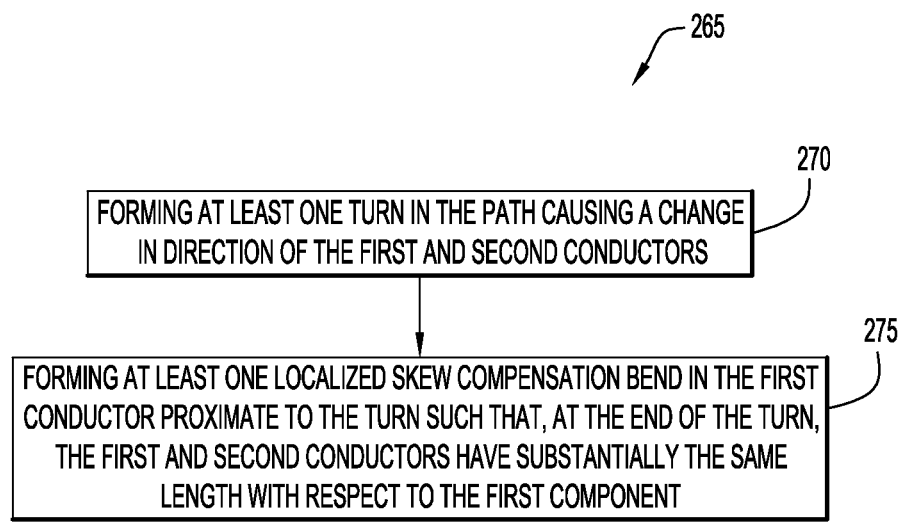

FIG. 10B is a flowchart of example operations performed at 265 of method 250 (FIG. 8A). More specifically, at 270, at least one turn is formed in the path of the differential conductor pair, thereby causing a change in direction of the first and second conductors. At 275, at least one localized skew compensation bend is formed in the first conductor proximate to the turn such that, at the end of the turn, the first and second conductors have substantially the same length with respect to the first component.

Skew compensation techniques described herein may provide several advantages to conventional techniques. Using a WBWC technique: almost no difference on differential-mode to differential-mode scattering parameter $S_{dd21}$ is observed, meaning that the signal integrity is not impacted; differential-mode to common-mode scattering parameter $S_{cd21}$ is reduced by 8-9 dB for 5-20 GHz, and this means less noise is transferred from differential mode to common mode and therefore the radiation will be reduced; TRP is reduced by 3-7 dB for 5-20 GHz.

On the other hand, regarding the pin escape offset for differential pair around the pin-field area, it is important to compensate the skew immediately close to the skew place. The compensation offset δ (see FIG. 5) does not influence $S_{dd21}$ but TRP. The bigger δ, the higher TRP is. The reason is that differential pair works in common mode before the signal passes the compensating bends, while in differential mode once the signal passes by the compensating bends. The bigger δ means the longer distance for common mode components to propagate and therefore produce higher TRP. Combined with PCB routing practice, it is recommended to have the bend offset δ<120 mil.

It is to be appreciated that the configuration (size, shape, etc.) of localized skew compensation bends of described above are merely illustrative. As such other configurations may be used in alternative arrangements.

The above description is intended by way of example only.

What is claimed is:

1. An apparatus comprising:
  a printed circuit board;
  a first component on the printed circuit board configured to generate a differential signal;
  a second component on the printed circuit board configured to receive the differential signal from the first component; and
  a differential conductor pair comprising first and second parallel conductors extending along a path between the first component and the second component,
  wherein the path of the differential conductor pair comprises at least one turn causing a change in direction of the first and second conductors, wherein the first conductor comprises first and second localized skew compensation bends collectively providing localized skew compensation at the turn, and wherein the first localized skew compensation bend is disposed in the first conductor before the turn and the second localized skew compensation bend disposed in the first conductor after the turn such that a portion of the localized skew compensation occurs before the turn and a portion of the localized skew compensation occurs after the turn and such that, at the end of the turn, the first and second conductors have substantially the same length with respect to the first component.

2. The apparatus of claim 1, wherein the first localized skew compensation bend comprises:
  at least first and second segments of the first conductor that are angled with respect to a longitudinal axis of the first conductor prior to the turn.

3. The apparatus of claim 2, wherein the first and second segments are each angled at approximately 45 degrees with respect to the longitudinal axis of the first conductor prior to the turn and wherein the first localized skew compensation bend comprises a third segment disposed between the first and second segments that is substantially parallel to the longitudinal axis of the first conductor prior to or after the turn.

4. The apparatus of claim 2, wherein the length ($Bend_v$) of the first and second segments is given by the following equation;

$$Bend_v = \frac{Skew_l}{Bend_n \times (2\sqrt{2} - 2)}$$

where $Skew_l$ is the length different between the first and second conductors as a result of the turn prior to performing skew compensation, and $Bend_n$ is the number of localized compensation bends used.

5. The apparatus of claim 3, where the length ($Bend_s$) of the third segment is approximately 0.5 to 1 times the length ($Bend_v$) of the first and second segments.

6. The apparatus of claim 3, wherein the first, second, and third segments have substantially the same length.

7. The apparatus of claim 2, wherein the differential signal has a wavelength, and wherein the length ($Bend_v$) of the first and second segments is proportional to the wavelength.

8. The apparatus of claim 1, wherein the first and second localized skew compensation bends each define a frusto-conical shape.

9. The apparatus of claim 1, wherein at the end of the turn the signal components of the differential signal remain substantially in-phase.

10. The apparatus of claim 1, wherein the path of the differential conductor pair comprises a plurality of turns and wherein first and second localized skew compensation bends are positioned on opposing sides of each of the plurality of turns.

11. The apparatus of claim 1, wherein the differential conductor pair extends from a pin field, and wherein the differential pair includes localized skew compensation bends adjacent to the pin field.

12. A method comprising:
  positioning a first component on a printed circuit board configured to generate a differential signal;
  positioning a second component on the printed circuit board; and
  positioning a differential conductor pair on the printed circuit board comprising first and second parallel conductors extending along a path between the first component and the second component, wherein positioning comprises:
    forming at least one turn in the path causing a change in direction of the first and second conductors; and
    forming a first localized skew compensation bend in the first conductor before the turn;
    forming a second localized skew compensation bend in the first conductor after the turn,
    wherein the first and second localized skew compensation bends collectively provide localized skew compensation such that a portion of the localized skew compensation occurs before the turn and a portion of the localized skew compensation occurs after the turn, and such that, at the end of the turn, the first and second conductors have substantially the same length with respect to the first component.

13. The method of claim 12, wherein forming the first localized skew compensation bend comprises:
  forming at least first and second substantially straight segments of the first conductor that are angled with respect to a longitudinal axis of the first conductor prior to the turn.

14. The method of claim 13, further comprising:
  forming first and second segments that are each angled at approximately 45 degrees with respect to the longitudinal axis of the first conductor prior to the turn; and forming a third segment substantially segment between the first and second segments that is substantially parallel to the longitudinal axis of the first conductor prior to the turn.

15. The method of claim 14, further comprising:
forming first, second, and third segments each having substantially the same length.

16. The method of claim 13, wherein forming the first and second segments further comprises:
forming the first and second segments each having a length ($Bend_v$) that is given by the following equation:

$$Bend_v = \frac{Skew_l}{Bend_n \times (2\sqrt{2} - 2)}$$

where $Skew_1$ is the length different between the first and second conductors as a result of the turn prior to performing skew compensation, and $Bend_n$ is the number of localized compensation bends.

17. The method of claim 12, wherein forming the first localized skew compensation bend comprises:
forming a bend in the first conductor that defines a frusto-conical shape.

18. The method of claim 12, wherein the differential conductor pair extends from a pin field, and wherein the method further comprises:
forming a bend in the first conductor adjacent to the pin field.

19. An apparatus comprising:
a printed circuit board;
a first component on the printed circuit board configured to generate a differential signal;
a second component on the printed circuit board configured to receive the differential signal from the first component; and
a differential conductor pair comprising first and second parallel conductors extending along a path between the first component and the second component,
wherein the path of the differential conductor pair comprises at least one turn causing a change in direction of the first and second conductors, wherein the first conductor comprises at least first and second localized skew compensation bends collectively providing localized skew compensation at the turn, and wherein the first localized skew compensation bend is disposed in the first conductor before the turn and the second localized skew compensation bend disposed in the first conductor after the turn such that a portion of the localized skew compensation occurs before the turn and a portion of the localized skew compensation occurs after the turn and such that, at the end of the turn, the signal components of the differential signal remain substantially in-phase.

20. The apparatus of claim 19, wherein the first and second localized skew compensation bends each define a frusto-conical shape.

21. The apparatus of claim 1, wherein the first localized skew compensation bend is such that half of the localized skew compensation occurs before the turn and half of the localized skew compensation occurs after the turn.

22. The method of claim 12, further comprising:
forming the first and second localized skew compensation bends in the first conductor such that half of the localized skew compensation occurs before the turn and half of the localized skew compensation occurs after the turn.

23. The apparatus of claim 19, wherein the first localized skew compensation bend is such that half of the localized skew compensation occurs before the turn and half of the localized skew compensation occurs after the turn.

* * * * *